(12) United States Patent
Templeton

(10) Patent No.: US 6,834,158 B1
(45) Date of Patent: Dec. 21, 2004

(54) PINHOLE DEFECT REPAIR BY RESIST FLOW

(75) Inventor: Michael K. Templeton, Atherton, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 107 days.

(21) Appl. No.: 09/951,473

(22) Filed: Sep. 13, 2001

Related U.S. Application Data

(60) Provisional application No. 60/234,658, filed on Sep. 22, 2000.

(51) Int. Cl.[7] .................................... F26B 3/30
(52) U.S. Cl. ................ 392/418; 392/416; 219/390; 219/405; 219/411; 438/795; 430/5; 430/322; 430/330; 430/311; 118/724; 118/725; 118/50.1
(58) Field of Search ................ 219/411, 413, 219/390, 405; 392/416, 418; 438/795; 118/724, 725, 50.1, 728, 730; 430/5, 322, 325, 330, 328, 311, 315

(56) References Cited

U.S. PATENT DOCUMENTS

| | | | |
|---|---|---|---|
| 5,278,012 A | * | 1/1994 | Yamanaka et al. ............ 430/30 |
| 5,935,734 A | * | 8/1999 | Pierrat ............................ 430/5 |
| 6,034,771 A | * | 3/2000 | Rangarajan et al. ........ 356/345 |
| 6,121,158 A | | 9/2000 | Benchikha et al. |
| 6,445,439 B1 | * | 9/2002 | McCullough ................ 355/30 |

OTHER PUBLICATIONS

International Search Report Dated Jun. 27, 2002 in PCT International Application No. PCT/US01/29565 filed Sep. 21, 2001.

* cited by examiner

Primary Examiner—Shawntina Fuqua
(74) Attorney, Agent, or Firm—Amin & Turocy, LLP

(57) ABSTRACT

According to one aspect of the present invention, pinhole defects in resist coatings are repaired by heating the resist briefly to induce the resist to flow and fill pinholes. The resist is brought to a temperature at or above that at which the resist flows for long enough to permit the resist to flow and fill pinhole defects, but not so long as to corrupt the resist pattern. The original resist pattern may be biased to allow for some flow during the pinhole repair process. The entire patterned resist may be heated at once, or it may be heated one portion at a time. The application of heat may optionally be limited to locations where pinhole defects are found. By means of the invention, very thin patterned resist coatings free from pinhole defects may be obtained.

36 Claims, 6 Drawing Sheets

PINHOLE DEFECT REPAIR BY RESIST FLOW

CROSS REFERENCE TO RELATED APPLICATION

Applicants claim, under 35 U. S. C. §119(e), the benefit of priority of U.S. Provisional Patent Application Ser. No. 60/234,658, filed on Sep. 22, 2000, the entire contents of which are incorporated herein by reference.

TECHNICAL FIELD

The present invention relates to semiconductor processing in general and in particular to a process for repairing pinhole defects in patterned resist coatings.

BACKGROUND OF THE INVENTION

In the semiconductor industry, there is a continuing trend toward higher device densities. To achieve these high densities there have been, and continue to be, efforts toward scaling down device dimensions on semiconductor wafers. In order to accomplish higher device density, smaller and smaller features sizes are required. These may include the width and spacing of interconnecting lines, spacing and diameter of contact holes, and surface geometry of corners and edges of various features.

High resolution lithographic processes are used to achieve small features with close spacing between adjacent features. In general, lithography refers to processes for pattern transfer between various media. Lithography is a technique used for integrated circuit fabrication in which a silicon slice, the wafer, is coated uniformly with a radiation-sensitive film, the resist. The film is selectively exposed with radiation (such as optical light, x-rays, or an electron beam) through an intervening master template, the mask, forming a particular pattern. Areas of the coating exposed through the mask become either more or less soluble (depending on the type of coating) in a particular solvent developer. The more soluble areas are removed in a developing process leaving the less soluble areas in the form of a patterned coating.

One type of defect that may occur in a patterned resist coating is a pinhole defect; a hole through the coating that may be only a few microns across. Pinhole defects may result from non-uniformities in the resist coating and preparation process, defects in the mask used to expose the resist, or non-uniformities in the developing process. Very thin resist coating are particularly vulnerable to pinhole defects. These defects may lead to problems, such as current leaks, in the finished device. There is an unsatisfied need for a process for repairing pinhole defects.

SUMMARY OF THE INVENTION

According to one aspect of the present invention, pinhole defects in resist coatings are repaired by heating the resist briefly to induce the resist to flow and fill pinholes. The resist is brought to a temperature at or above that at which the resist flows for long enough to permit the resist to flow and fill pinhole defects, but not so long as to corrupt the resist pattern. The original resist pattern may be biased to allow for some flow during the pinhole repair process. The entire patterned resist may be heated at once, or it may be heated one portion at a time. The application of heat may optionally be limited to locations where pinhole defects are found. By means of the invention, very thin patterned resist coatings free from pinhole defects may be obtained In one aspect, the invention provides a system for repairing pinhole defects in a patterned resist coating on a substrate, the system including a heating device that heats the resist in a controlled manner causing the resist to flow sufficiently to close pinhole defects while substantially preserving the resist pattern.

In another aspect, the invention provides a system for repairing pinhole defects in a patterned resist coating on a substrate, the system including means for heating the resist in a controlled manner to cause the resist to flow sufficiently to repair the pinhole defects In another aspect, the invention provides a method of processing a substrate with a patterned resist coating having pinhole defects including the step of applying sufficient heat to the resist to cause the resist to flow and thereby close one or more pinhole defects in the resist coating.

In another aspect, the invention provides a method of preparing a patterned resist coating including the steps of forming the resist into a coating with a pattern that is slightly smaller than the desired coating pattern and applying heat to the resist thereby causing it to flow until it forms the desired pattern.

In a further aspect, the invention provides a method of repairing pinhole defects in a patterned resist coating including steps for causing the resist to flow and fill the pinhole defects.

The invention extends to features hereinafter fully described and features particularly pointed out in the claims. The following detailed description and the annexed drawings set forth in detail certain illustrative examples of the invention. These examples are indicative of but a few of the various ways in which the principles of the invention may be employed. Other ways in which the principles of the invention may be employed and other objects, advantages and novel features of the invention will be apparent from the detailed description of the invention when consider in conjunction with the drawings.

DETAILED DESCRIPTION OF THE INVENTION

Figure 1A:
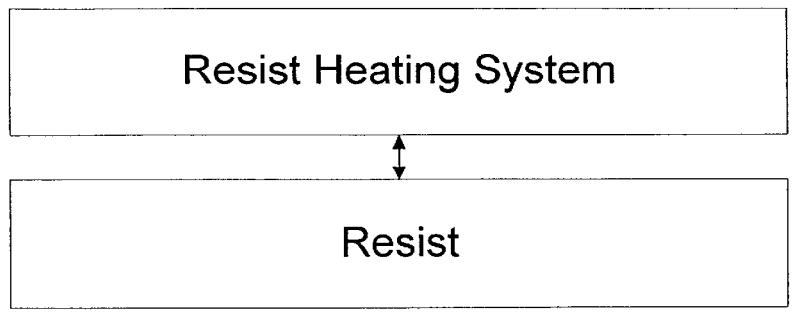
FIG. 1a is a high level schematic illustration of a system according to one aspect of the invention.

In one aspect, the invention provides, as illustrated in FIG. 1a, a system for heating a resist to repair pinhole defects. The system is heated in a controlled manner causing a limited resist flow that closes pinhole defects. Cooling may simultaneously be applied to limit the extent to which the resist is heated and the extent to which it flows.

Figure 1B:
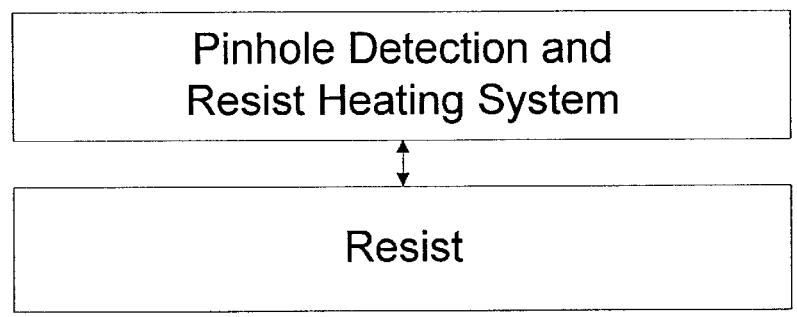
FIG. 1b is a high level schematic illustration of another system according to one aspect of the invention.
Figure 1C:
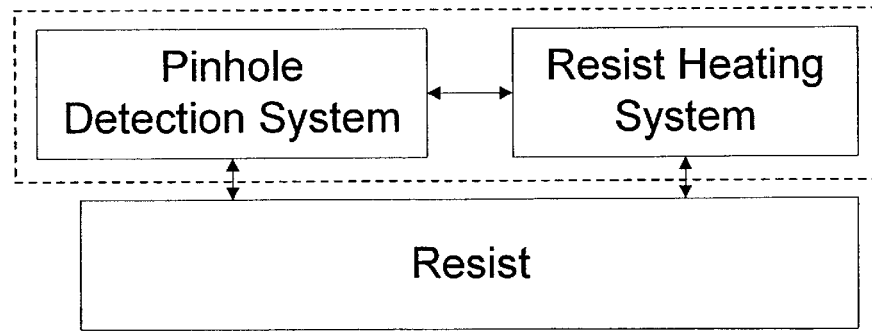
FIG. 1c is a high level schematic illustration of another system according to one aspect of the invention.

In another aspect, the invention provides, as illustrated in FIG. 1b, a system for detecting pinhole defects in selectively heating the resist to repair pinhole defects. The system scans the resist for pinhole defects and selectively applies heat to cause a limited resist flow where pinhole defects are found. The pinhole defect detection and system can be part of one device or system, as illustrated in FIG. 1b, or they may be in separate devices and systems, as illustrated in FIG. 1c.

Figure 1D:
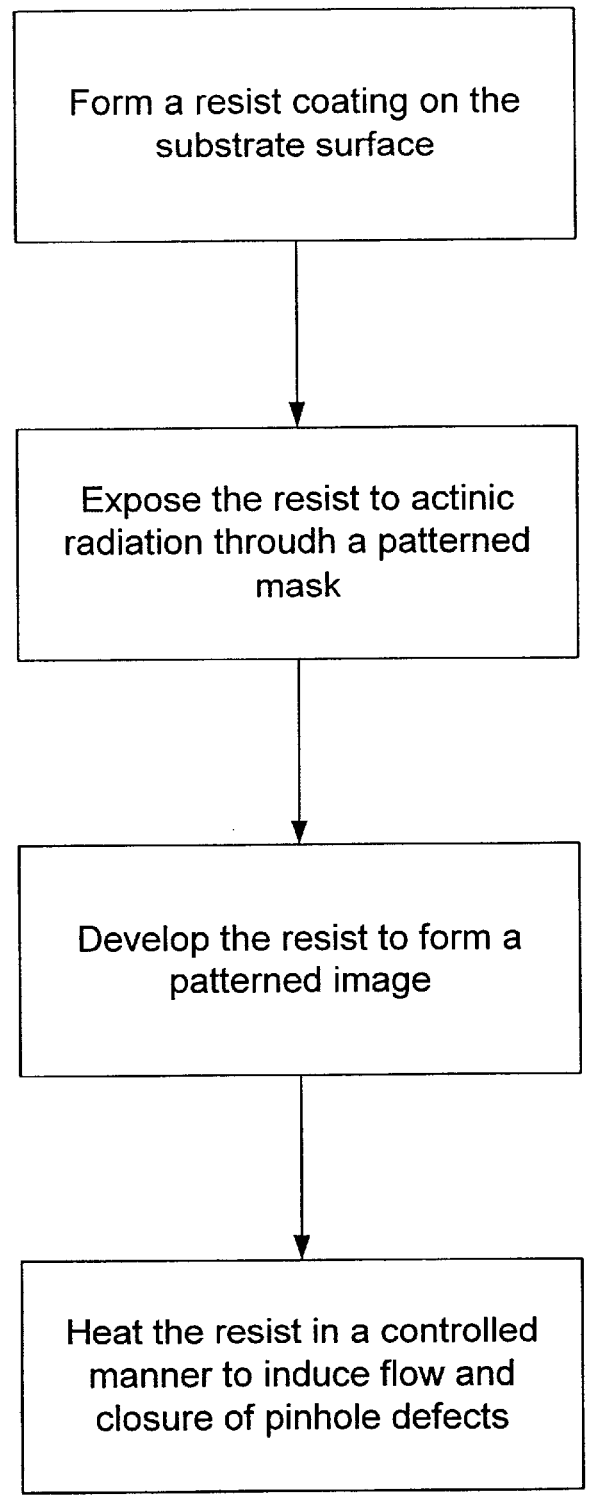
FIG. 1d is a schematic diagram of a process according to one aspect of the invention.

In a further aspect, the invention provides a method in which a patterned resist is heated to induce the resist to flow and fill pinhole defects in the patterned resist coating. FIG. 1d is a block diagram of such a process. The resist is first coated on the substrate. The resist is than selectively exposed to actinic radiation through a mask, after which the less soluble portion of the resist is preferentially removed with the developer. The resist is then carefully heated to cause flow sufficient to close pinhole defects.

The substrate is typically a semi-conducting material, such as silicon. In addition to a semiconducting material, the substrate may include various elements and/or layers; including metal layers, barrier layers, dielectric layers, device structures, active elements and passive elements including silicon gates, word lines, source regions, drain regions, bit lines, bases emitters, collectors, conductive lines, conductive plugs, etc. Usually, these materials will have melting points and glass transition temperatures above the temperature at which the resist flows.

The resist may be of virtually any type. It may be organic or inorganic, positive or negative tone, polymeric or non-polymeric. The resist may be a photoresist responsive to visible light, ultraviolet light, or x-rays, or the resist may be an electron beam resist or an ion beam resist. The resist may be chemically amplified. Resists are commercially available from a number of sources, including Shipley Company, Kodak, Hoechst Celanese Corporation, Clariant, JSR Microelectronics, Hunt, Arch Chemical, Aquamer, and Brewer. Specific examples of resist coatings include novalacs, poly-t-butoxycarbonyloxystyrenes (PBOCOS), poly-methylmethacrylates (PMMA), poly(olephin sulfones) (POS), and poly(methyl isophenyl ketones) (PMIPK).

The resist coating may be formed on the substrate surface by any suitable means. Spin coating, dip coating, or vapor deposition may be used, depending on the coating material. For example, a 157 nm sensitive photoresist, a 193 nm sensitive photoresist, an I-line, H-line, G-line, E-line, mid UV, deep UV, or extreme UV photoresist may be spin-coated on the substrate surface. Prior to exposure, the resist coating is often "soft-baked" to drive off solvent, improve adhesion of the resist to the substrate, and anneal stresses caused by shear forces encountered in the spinning process.

The prepared coating is selective exposed through a mask to actinic radiation, which renders the exposed portion of the resist either more or less soluble, depending on the tone of the resist, in a developer solution. After exposure, but prior to development, the mask image, or its negative, is latent with the resist coating. The processes of the invention may be applied prior to development, however, it is more usual to apply these processes after development, when the pinhole defects are exposed. Pinhole defects may also be created by the development process, rather than merely exposed by the development process.

Pinhole defects in the resist coating are repaired by heating the resist to a temperature at or above that at which the resist begins to flow and maintaining that temperature for at least a sufficient time for the resist to flow and substantially close the pinhole defects. The temperature at which the resist will flow depends, of course, on the identity of the resist, but may also depend on the coating thickness and the composition of the substrate surface. Generally the resist will begin to flow at a temperature from about 100° C. to about 300° C., with commonly used resist such as novolac falling near the lower end of this range. In one aspect, the invention involves heating to resist to a temperature from about 100° C. to about 150° C. In another aspect, the invention involves heating to resist to a temperature from about 100° C. to about 120° C.

The time for which the resist is maintained at a temperature at which it flows is generally brief, sufficiently long to close pinhole defects, but not so long as to substantially alter the resist pattern. In one aspect of the invention, the resist is patterned with narrowed features to allow for some broadening during the pinhole defect repair process.

The resist is usually heated for less than about 5 seconds. In one aspect of the invention, the time is less than about 1 second. In another aspect of the invention, the time is less than 0.1 seconds. In general, the higher the temperature to which the resist is raised above the temperature at which the resist begins to flow, the shorter the time that temperature will be maintained.

The resist may be heated all at once, one portion at a time, or selectively where pinhole defects are found. The heated resist may be allowed to cooled by dissipation of the heat into unheated portions of the substrate and the surrounding, or the resist may be cooled using a heat sink such as a cooling plate or a flow of cooling gas. A cooling source may be applied simultaneously with heating to facilitate a rapid temperature drop after heating discontinues.

The resist may be heated all at once using any suitable means. Examples include one or more heat lamps, a hot plate on which the substrate is placed, a hot surface placed above the resist in proximity to the resist surface, or a flow of hot gas. When the entire substrate is heated at once, heating is advantageously kept uniform and sensing the temperature of the substrate to control the heating process is generally desirable.

Figure 2:
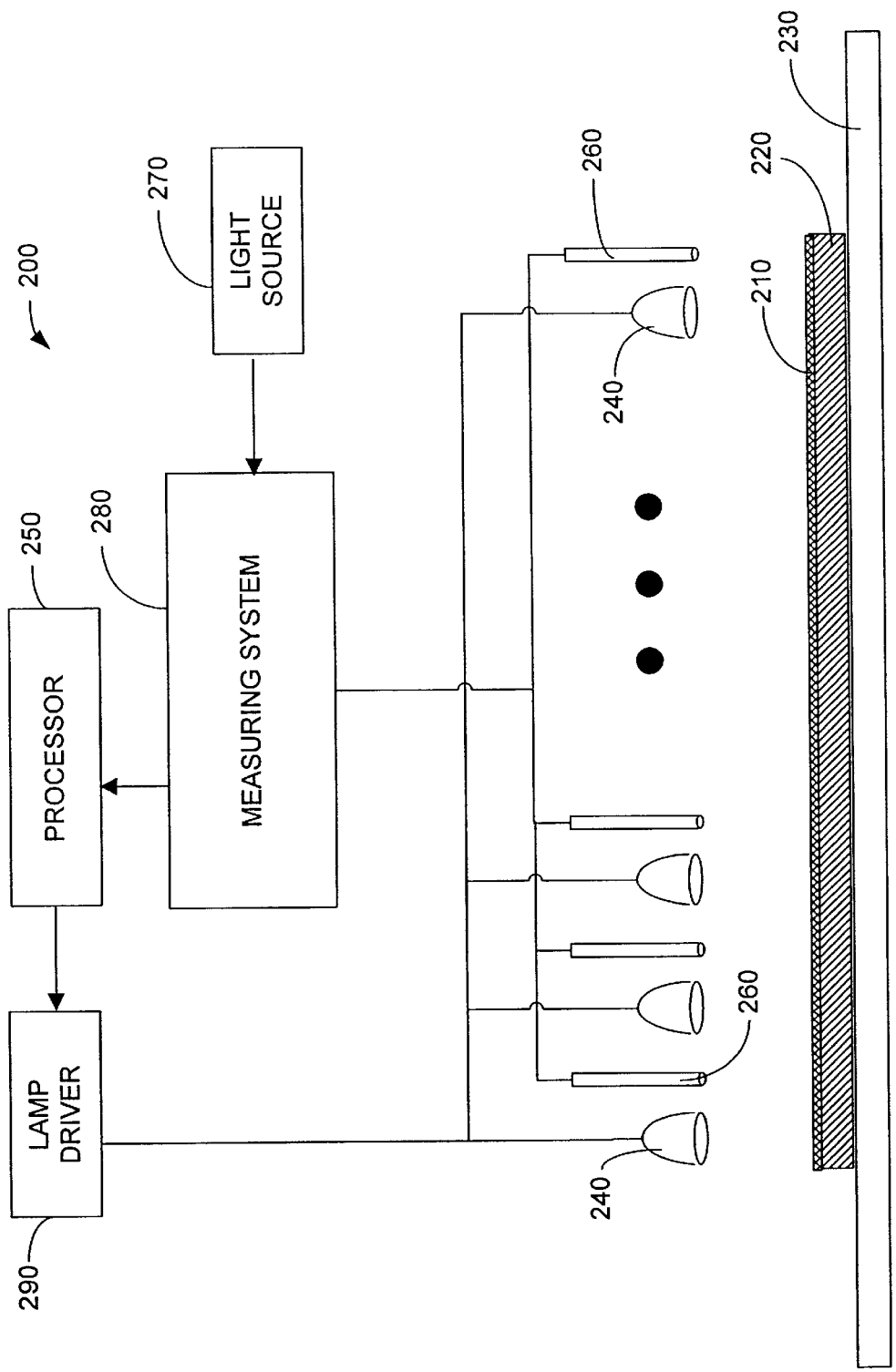
FIG. 2 is a schematic illustration of an apparatus that can be used to implement processes according to one aspect of the invention.

FIG. 2 provides an example of a system 200 for heating a resist 210 with temperature feedback. The substrate 220 is supported over plate 230. A plurality of heat lamps 240, arranged in a grid pattern over the resist, are selectively controlled by processor 250 to uniformly heat resist 210. A plurality of optical fibers 260 project radiation onto respective portions of the resist 210. Radiation from source 270 is reflected from the resist 210 and processed by a resist parameter measuring system 280 to measure at least one parameter relating to the temperature of the resist 210.

Measuring system 280 may include an interferometer or a spectrometer. Monochromatic radiation, such as laser light, from source 270 is directed to resist 210 by a plurality of optical fibers 260 via the measuring system 280. Processor 250 receives the measured data from the measuring system 280 and determines the temperature of respective portions of the resist 210. The processor 250 is operatively coupled to measuring system 280 and is programmed to control and operate the various components within the resist heating system 200 in order to carry out a pinhole repair process. The processor 250 is also coupled to a lamp driving system 290 which drives the heat lamps 240. The lamp driving system 290 is controlled by the processor 250 so as to selectively vary heat output of the respective heat lamps 240. Each respective portion of the resist 210 has a corresponding lamp 240 and an optical fiber 260 associated therewith. The processor 250 is able to monitor the temperature of the various resist portions and selectively regulate the temperatures of each portion via the corresponding heat lamps 240. As a result, the system 200 regulates the temperature of resist 210 with substantial uniformity and thereby facilitates the process of inducing flow sufficient to eliminate pinhole defects while substantially preserving the resist pattern.

Once sufficient heat has been applied to the resist, it may be allowed to cool by natural convection and dissipation of heat to unheated portions of the substrate and surroundings until resist flow terminates. However, applying a cooling source can facilitate control over the extent of flow. Examples of cooling sources include a cold plate on which the substrate is placed and cool gas convected over the substrate. A cold plate may be cooled by circulating cold fluid or by Peltier elements. Cool gases may be provided from a reservoir, by passing the gas through a heat exchanger, or by venting the gas from a high pressure source thereby utilizing the Joule-Thompson effect. Particularly where a cold plate is used, cooling may be carried out simultaneously with heating to facilitate rapid cooling after heating is discontinued.

A specific example is illustrated by FIG. 2 where plate 230 is a cold plate with a cold fluid circulating through it. As substrate 230 is heated from above and cooled from below, a temperature gradient develops within substrate 230, whereby resist 210 is at a temperature above the average temperature of substrate 230. When sufficient heat has been supplied to flow the resist and close pinhole defects, heating is discontinued and the resist cools rapidly due to conduction of heat to the cooler portions of substrate 230. Thereby, flow of resist 210 abruptly terminates and the extent of resist flow is accurately controlled.

Figure 3:
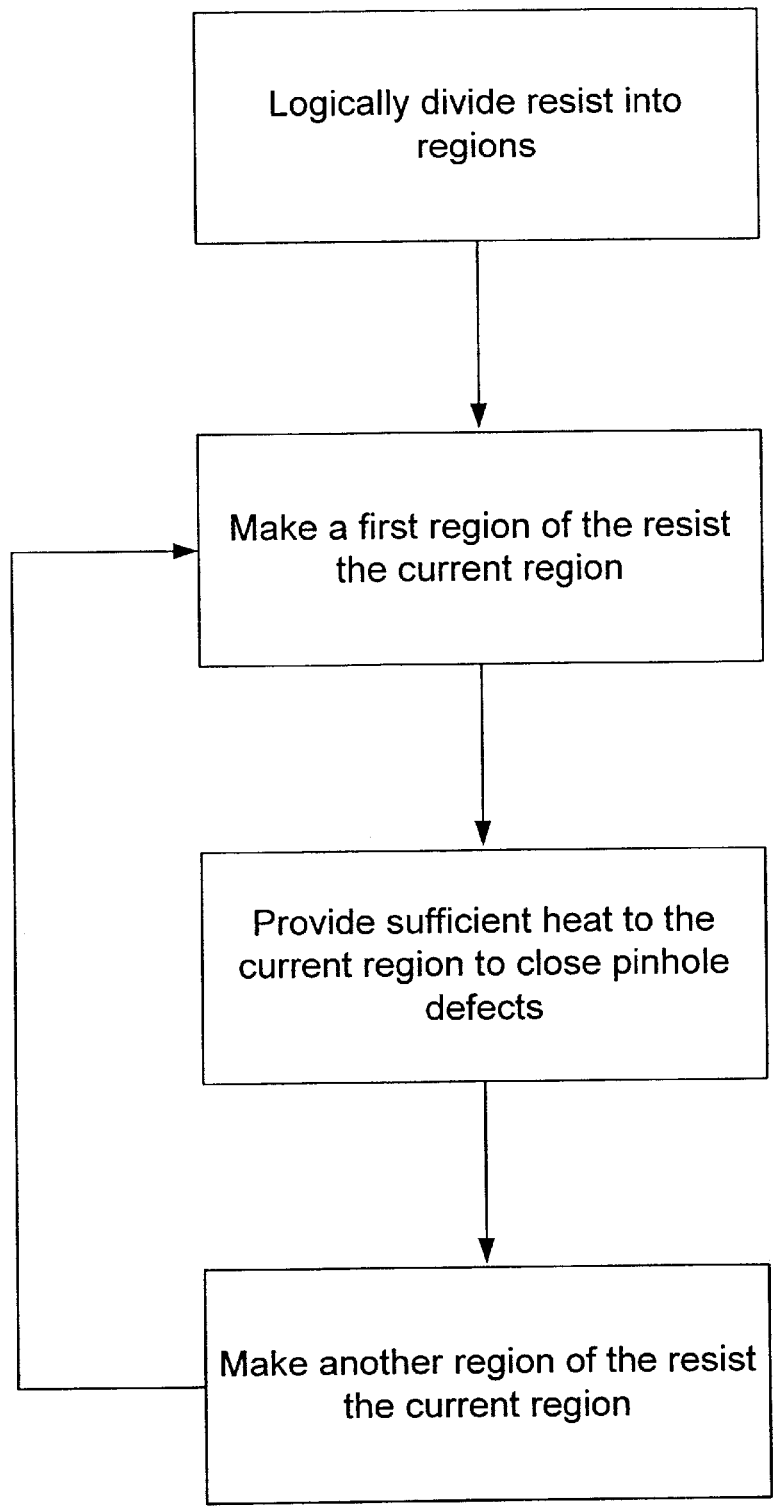
FIG. 3 is a schematic diagram of a process according to another aspect of the invention.

An alternative approach is to heat the patterned resist one portion at a time, as shown schematically in FIG. 3. For example, the resist may be divided into a grid and heated one grid portion at a time or it may be divided into a series of bands and heated one band at a time. The source of heat may scan across the resist, or it may jump from one region to another. An advantage of heating the resist one portion at a time is that unheated portions of the resist and substrate can act as a heat sink to facilitate rapid termination of resist flows.

A system similar to that shown in FIG. 2 may be used to scan across the substrate heating one band of the resist at a time. In this example, the heating lamps and temperature sensors are placed in a row and the substrate is carried past the lamps and sensors in a direction perpendicular to the row. The processor may be coupled to the system for moving the substrate so that the rate of movement may be controlled in addition to the intensity of light from the lamps. A cooling plate may be placed beneath the substrate and conveyed along with the substrate past the heating lamps.

Figure 4:
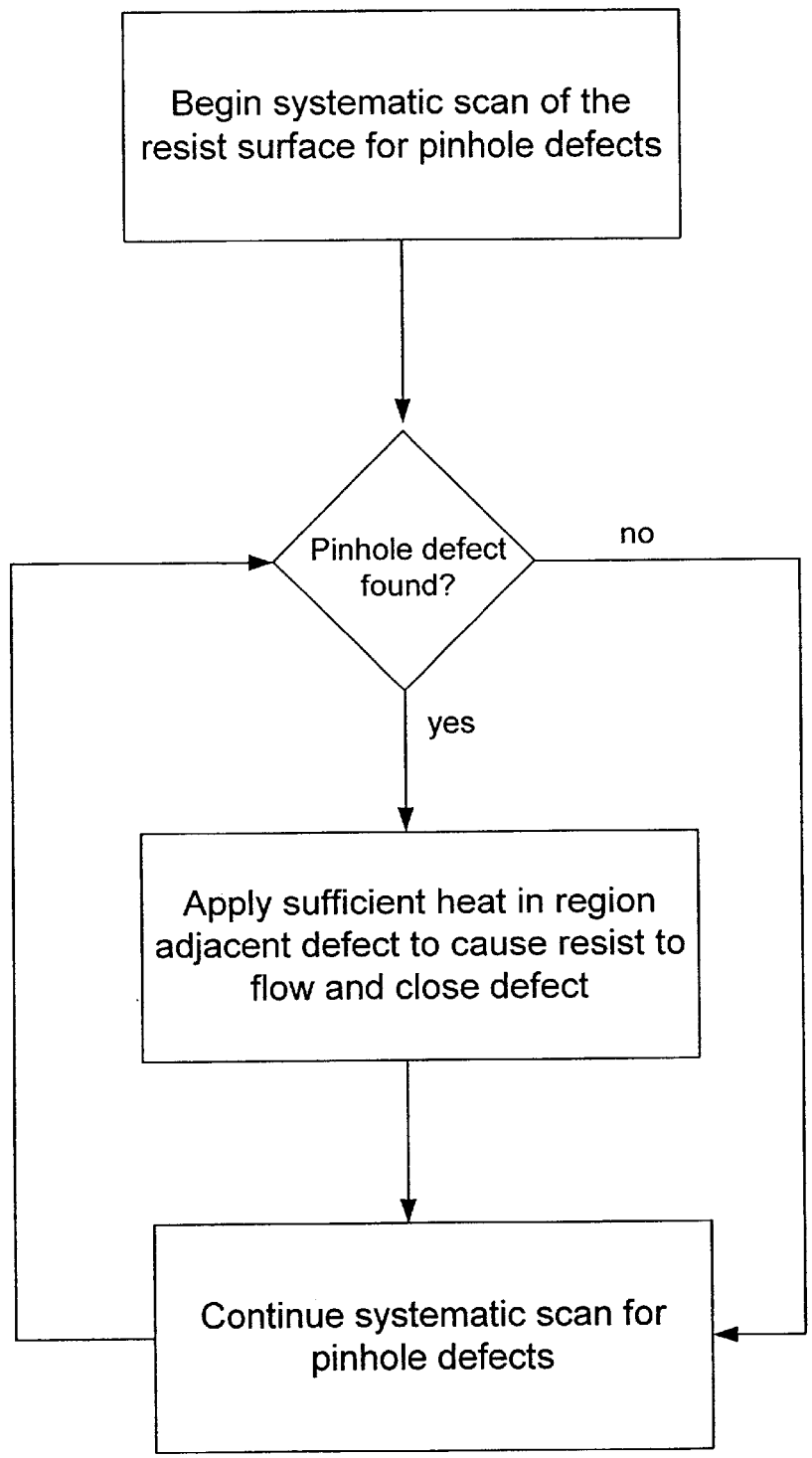
FIG. 4 is a schematic diagram of a process according to a further aspect of the invention.

Another approach, which is schematically illustrated in FIG. 4, is to locate pinhole defects and selectively heat the resist in the vicinity of the defects. Depending on their size, defects may be detected by any suitable means, including an optical microscope, an electron microscope, or a scanning probing microscope, such as an atomic force microscope or a scanning tunneling microscope. Heat may be applied to the resist in the vicinity of the pinhole defect by any suitable means, including a heat lamp, a laser, or a hot surface place in proximity to the resist. A surface in the vicinity of the resist may be heated, for example, by flowing a current through a resistive element or by shining a laser on an absorbing surface, such as gold plating. Suitable lasers for heating the resist or an absorbing element may have wavelengths from the UV range to the infrared and may be pulsed or continuous. UV laser have an advantage in that they can be focused more narrowly than visible light or infrared lasers, but UV lasers have the disadvantage of causing chemical decomposition of some materials.

Figure 5:
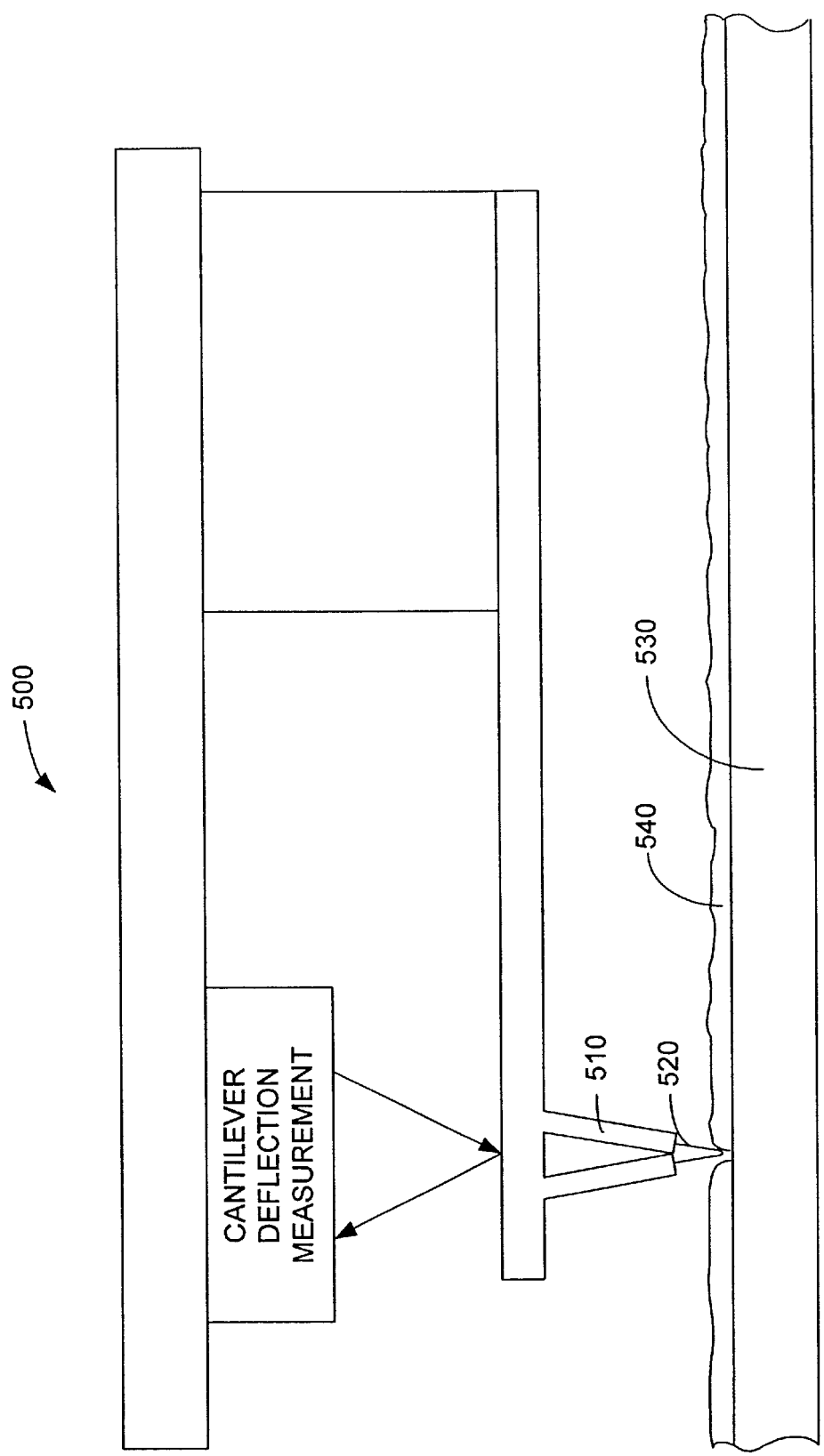
FIG. 5 is a schematic illustration of an atomic force microscope that can be used to implement one aspect of the invention.

An exemplary system for locating and repairing pinhole defects is illustrated by FIG. 5. Atomic force microscope 500 has a tip 510 provided with a platinum/rhodium wire 520. Microscope 500 scans across the surface of substrate 530, which is coated with resist 540. When a pinhole defect is detected in resist 540, tip 510 is centered above the hole, raised out of the hole and slightly above resist 540, and a sufficient current is run through wire 520 to heat resist 540 around the hole until resist 540 flows and fills the hole. Alternatively, tip 510 may be provided with gold plating and heat provided by focusing a laser on the plated portion of tip 510. The heat could also be provided directly to the resist, for example, by focusing the laser on the resist. The heat could also be generated by a heating element that is separate from the sensing tip of the microscope. A stream of cold air blowing around the area to be heated can be used to help localize the are in which the resist flows. Likewise, a controlled flow may be facilitated by a cooling plate below the substrate.

What has been described above is the present invention and several of its specific aspects. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A system for repairing pinhole defects in a patterned resist coating on a substrate, comprising:

a heating device that selectively heats the resist where pinhole defects are detected in a controlled manner causing the resist to flow sufficiently to close pinhole defects while substantially preserving the resist pattern.

2. The system of claim 1, wherein the same device is used to detect and repair pinhole defects.

3. The system of claim 1, further comprising a cooling device.

4. The system of claim 3, wherein the heating and cooling devices are applied simultaneously.

5. The system of claim 4, wherein the heating and cooling devices create a temperature gradient through the substrate.

6. A system for repairing pinhole defects in a patterned resist coating on a substrate, comprising, means for selectively heating the resist where pinhole defects are detected in a controlled manner to cause the resist to flow sufficiently to repair the pinhole defects.

7. The system of claim 6 further comprising means for detecting pinhole defects.

8. The system of claim 7, wherein the system selectively heats the resist where pinhole defects are found.

9. A method of repairing pinhole defects in a patterned resist coating on a substrate comprising:

selectively applying sufficient heat in a controlled manner to the resist coating where one or more pinhole defects are detected to cause the resist coating to flow and close one or more pinhole defects in the resist coating.

10. The method of claim 9, further comprising cooling the resist coating to limit the extent of resist flow.

11. The method of claim 9, the substrate is cooled while heat is being applied to the resist coating.

12. The method of claim 9, the resist coating is heated with radiant energy.

13. The method of claim 9, the resist coating is heated by bringing a hot surface close to the resist coating.

14. The method of claim 9, further comprising:
locating the one or more pinhole defects in the patterned resist coating; and
heating the resist coating to a temperature at or above that at which the resist coating begins to flow only in the immediate vicinities of the located the one or more pinhole defects.

15. The method of claim 14, the one or more pinhole defects are located with a scanning probe microscope.

16. The method of claim 14, the resist coating is heated with a resistive element.

17. The method of claim 14, the resist coating is heated by heating an object held close to the resist coating.

18. The method of claim 17, the object held close to the resist coating is heated with a laser.

19. The method of claim 14, the resist coating is heated with a laser.

20. The method of claim 19, the laser is pulsed.

21. The method of claim 9, the patterned resist coating is heated with a source that is scanned over the patterned resist coating, whereby the resist coating is cause to flow region by region.

22. The method of claim 9, the patterned resist coating is heated in bands.

23. The method of claim 9, the patterned resist coating is heated and caused to flow all at once.

24. A method of repairing pinhole defects in a patterned resist coating, comprising causing the resist coating to flow and fill the pinhole defects where the one or more pinhole defects are detected.

25. A system for repairing pinhole defects in a patterned resist coating on a substrate, comprising:
a plurality of optical fibers that project radiation onto respective portions of the resist;
a resist parameter measuring system that measures at least one parameter relating to the temperature of the resist based on radiation reflected from the resist; and
a processor that selectively controls a heating device(s) to heat the resist based upon information from the resist parameter measuring system, the processor driving the heating device(s) to heat the resist in a controlled manner causing the resist to flow sufficiently to close pinhole defects while substantially preserving the resist pattern.

26. The system of claim 25, further comprising a pinhole detection device, wherein the heating device(s) selectively applies heat to the resist only in areas where pinhole defects are detected.

27. The system of claim 26, wherein the same device is used to detect and repair pinhole defects.

28. The system of claim 25, further comprising a cooling device.

29. The system of claim 28, wherein the heating and cooling devices are applied concurrently.

30. The system of claim 29, wherein the heating and cooling devices create a temperature gradient through the substrate.

31. A system for repairing pinhole defects in a patterned resist coating on a substrate, comprising:
means for projecting radiation onto respective portions of the resist;
means for measuring at least one parameter relating to the temperature of the resist based on radiation reflected from the resist;
means for heating the resist; and
means for controlling the heating means to heat the resist based upon information from the measuring means, the controlling means driving the heating means to heat the resist in a controlled manner causing the resist to flow sufficiently to close pinhole defects while substantially preserving the resist pattern.

32. The system of claim 31, further comprising means for detecting pinhole defects, wherein the heating means selectively applies heat to the resist only in areas where pinhole defects are detected.

33. The system of claim 32, wherein a single means is used to detect and repair pinhole defects.

34. The system of claim 31, further comprising means for cooling the resist.

35. The system of claim 34, wherein the heating and cooling means are applied simultaneously.

36. The system of claim 35, wherein the heating and cooling means create a temperature gradient through the substrate.

* * * * *